United States Patent
Shideler et al.

(10) Patent No.: US 6,913,981 B2
(45) Date of Patent: Jul. 5, 2005

(54) METHOD OF FABRICATING A BIPOLAR TRANSISTOR USING SELECTIVE EPITAXIALLY GROWN SIGE BASE LAYER

(75) Inventors: Jay Albert Shideler, Los Altos Hills, CA (US); Jayasimha Swamy Prasad, San Jose, CA (US); Ronald Lloyd Schlupp, Los Gatos, CA (US); Robert William Bechdolt, San Jose, CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 10/441,763

(22) Filed: May 19, 2003

(65) Prior Publication Data

US 2004/0043576 A1 Mar. 4, 2004

Related U.S. Application Data

(62) Division of application No. 10/231,986, filed on Aug. 29, 2002, now Pat. No. 6,699,765.

(51) Int. Cl.$^7$ .......................................... H01L 21/8222
(52) U.S. Cl. ...................... 438/309; 438/312; 438/365
(58) Field of Search ................................ 438/312, 309, 438/313, 317, 318, 320, 350, 365

(56) References Cited

U.S. PATENT DOCUMENTS

| | | | |
|---|---|---|---|
| 4,599,705 A | 7/1986 | Holmberg et al. | |
| 4,871,685 A | * 10/1989 | Taka et al. | 148/DIG. 10 |
| 5,001,538 A | 3/1991 | Pollock et al. | |
| 5,029,129 A | 7/1991 | Wai Wong | |
| 5,105,253 A | 4/1992 | Polllock | |
| 5,188,971 A | 2/1993 | Pollock et al. | |
| 5,200,924 A | 4/1993 | Wong | |
| 5,381,057 A | 1/1995 | Kuroda et al. | |
| 5,384,498 A | 1/1995 | Wong | |

(Continued)

FOREIGN PATENT DOCUMENTS

WO    WO 01/91162 A2    11/2001

*Primary Examiner*—Tuan H. Nguyen
(74) *Attorney, Agent, or Firm*—Bever, Hoffman & Harms, LLP

(57) ABSTRACT

Embodiments of a bipolar transistor are disclosed, along with methods for making the transistor. An exemplary transistor includes a collector region in a semiconductor substrate, a base layer overlying the collector region and bound by a field oxide layer, a dielectric isolation layer overlying the base layer, and an emitter structure overlying the dielectric isolation layer and contacting the base layer through a central aperture in the dielectric layer. The transistor may be a heterojunction bipolar transistor with the base layer formed of a selectively grown silicon germanium alloy. A dielectric spacer may be formed adjacent the emitter structure and over a portion of the base layer.

41 Claims, 9 Drawing Sheets

U.S. PATENT DOCUMENTS

| | | | |
|---|---|---|---|
| 5,455,191 A | 10/1995 | Gray et al. | |
| 5,506,427 A | 4/1996 | Imai | |
| 5,930,635 A | 7/1999 | Bashir et al. | 438/313 |
| 5,962,879 A | 10/1999 | Ryum et al. | 257/198 |
| 5,965,931 A | 10/1999 | Wang et al. | 257/585 |
| 5,986,287 A | 11/1999 | Eberl et al. | |
| 6,004,855 A | 12/1999 | Pollock et al. | |
| 6,040,225 A | 3/2000 | Boles | 438/314 |
| 6,049,098 A | 4/2000 | Sato | 257/198 |
| 6,087,683 A | 7/2000 | King et al. | 257/183 |
| 6,169,007 B1 | 1/2001 | Pinter | 438/320 |
| 6,190,984 B1 | 2/2001 | Ryum et al. | 438/309 |
| 6,222,951 B1 | 4/2001 | Huang | 385/14 |
| 6,235,567 B1 | 5/2001 | Huang | 438/202 |
| 6,251,738 B1 | 6/2001 | Huang | 438/312 |
| 6,255,674 B1 | 7/2001 | Luy et al. | 257/198 |
| 6,288,427 B2 | 9/2001 | Huang | 257/350 |
| 6,303,419 B1 * | 10/2001 | Chang et al. | 438/202 |
| 6,316,795 B1 | 11/2001 | Croke, III | 257/197 |
| 6,316,818 B1 | 11/2001 | Marty et al. | 257/592 |
| 6,329,259 B1 | 12/2001 | Johansson | 438/315 |
| 6,333,235 B1 * | 12/2001 | Lee et al. | 438/309 |
| 6,337,251 B1 | 1/2002 | Hashimoto | 438/309 |
| 6,337,494 B1 | 1/2002 | Ryum et al. | 257/197 |
| 6,346,453 B1 | 2/2002 | Kovacic et al. | 438/312 |
| 6,352,901 B1 * | 3/2002 | Chang | 438/309 |
| 6,362,065 B1 | 3/2002 | Swanson et al. | 438/344 |
| 6,362,066 B1 | 3/2002 | Ryum et al. | 438/364 |
| 6,455,364 B1 * | 9/2002 | Asai et al. | 438/235 |
| 6,492,711 B1 * | 12/2002 | Takagi et al. | 257/593 |
| 6,534,371 B2 * | 3/2003 | Coolbaugh et al. | 438/312 |
| 6,605,498 B1 | 8/2003 | Murthy et al. | |
| 6,621,131 B2 | 9/2003 | Murthy et al. | |
| 6,670,654 B2 | 12/2003 | Lanzerotti et al. | |
| 6,699,765 B1 | 3/2004 | Shideler et al. | |
| 2002/0121676 A1 * | 9/2002 | Chu et al. | 257/592 |
| 2003/0006484 A1 * | 1/2003 | Asai et al. | 257/565 |
| 2003/0011001 A1 * | 1/2003 | Chevalier et al. | 257/197 |

* cited by examiner

METHOD OF FABRICATING A BIPOLAR TRANSISTOR USING SELECTIVE EPITAXIALLY GROWN SIGE BASE LAYER

RELATED APPLICATIONS

This application is a divisional of U.S. patent application Ser. No. 10/231,986, entitled "Method of Fabricating a Bipolar Transistor Using Selective Epitaxially Grown SiGe Base Layer" filed Aug. 29, 2002, now U.S. Pat. No. 6,699,765.

BACKGROUND OF THE INVENTION

1. Field of the Invention

The invention relates to a bipolar transistor.

2. Description of the Related Art

A typical bipolar transistor has an emitter, a base, and a collector. Typically, the emitter and collector are semiconductor materials of one type (N- or P-type), and the base is a semiconductor material of an opposite type (P- or N-type), such that NPN or PNP junctions are formed between the emitter, base, and collector.

When the transistor is activated, a small forward bias voltage is applied between the emitter and the base. The bias voltage lowers the energy barrier that exists at the junction between the emitter and the base, causing the transistor to turn on. When such a junction is made between materials of the same basic composition, the junction is called a homojunction. When such a junction is made between two dissimilar materials, the junction is called a heterojunction.

Lately, practitioners have focused on heterojunction bipolar transistors (HBT) in an attempt to achieve higher switching speeds. For instance, one type of HBT includes an emitter structure formed of N-doped polysilicon and a base layer formed of a P-doped silicon germanium alloy (SiGe).

SUMMARY OF THE INVENTION

The invention relates to a bipolar transistor in a semiconductor chip, and methods of fabricating the transistor. The transistor may be used, for instance, in a bipolar or BiCMOS process. The transistor may be a heterojunction bipolar transistor with either a drift or a box profile.

An exemplary embodiment of a bipolar transistor within the present invention includes an emitter structure, a base layer, and a collector layer. A dielectric isolation layer including a central aperture overlies the base layer and a bird's beak region of an adjacent field oxide layer. An emitter structure makes contact with the base layer through the central aperture of the dielectric isolation area, forming the emitter-base junction. A collector pedestal implant region may be formed directly beneath the central aperture of the dielectric isolation layer. A base contact may be coupled to base layer through a link implant region.

In one embodiment, the transistor is a heterojunction bipolar transistor. The base layer of such a transistor may be formed of selectively grown SiGe.

An exemplary method of forming a bipolar transistor within the present invention includes providing a substrate including a region of a first type; forming a buried layer of a second type in the region of the substrate; forming an epitaxy layer of the second type on the buried layer; masking the surface of the epitaxy layer for defining an active area; forming a field oxide layer on the surface of the epitaxy layer surrounding the active area; patterning the substrate to define a base region in the active area; growing in the base region a base layer (e.g., selectively grown SiGe) bound by the field oxide layer; forming a dielectric isolation layer having a central aperture over the base layer and an adjacent bird's beak area of the field oxide layer; forming an emitter structure over the dielectric isolation layer in a manner such that the material of the emitter structure contacts the SiGe layer through the central aperture in the dielectric isolation layer, so that an emitter-base junction may be formed; and forming a collector contact and a base contact.

The present invention will be better understood upon consideration of the detailed description below and the accompanying drawings.

BRIEF DESCRIPTION OF THE DRAWINGS

In the present disclosure, like objects that appear in more than one figure are provided with like reference numerals.

DETAILED DESCRIPTION

FIGS. 1–7 illustrate steps of a process within the present invention for forming a bipolar transistor within the present invention. In this particular instance, the bipolar transistor is a heterojunction bipolar transistor (HBT), and includes a dielectric isolation layer between the emitter structure and the base layer. Among other things, the dielectric isolation layer places a high dopant concentration of an emitter structure away from an extrinsic base region, thereby reducing emitter-base capacitance. The dielectric isolation layer serves to protect a bird's beak region of a field oxide layer that is adjacent to the base layer during the fabrication process. The dielectric isolation layer also may be used as a mask for performing a collector pedestal implant that can minimize the well known Kirk effect, also called base push-out effect. The collector pedestal implant is thereby self-aligned with the emitter to ensure maximum effectiveness. A high performance heterojunction bipolar transistor with improved performance and manufacturability is thereby attained.

Figure 1:
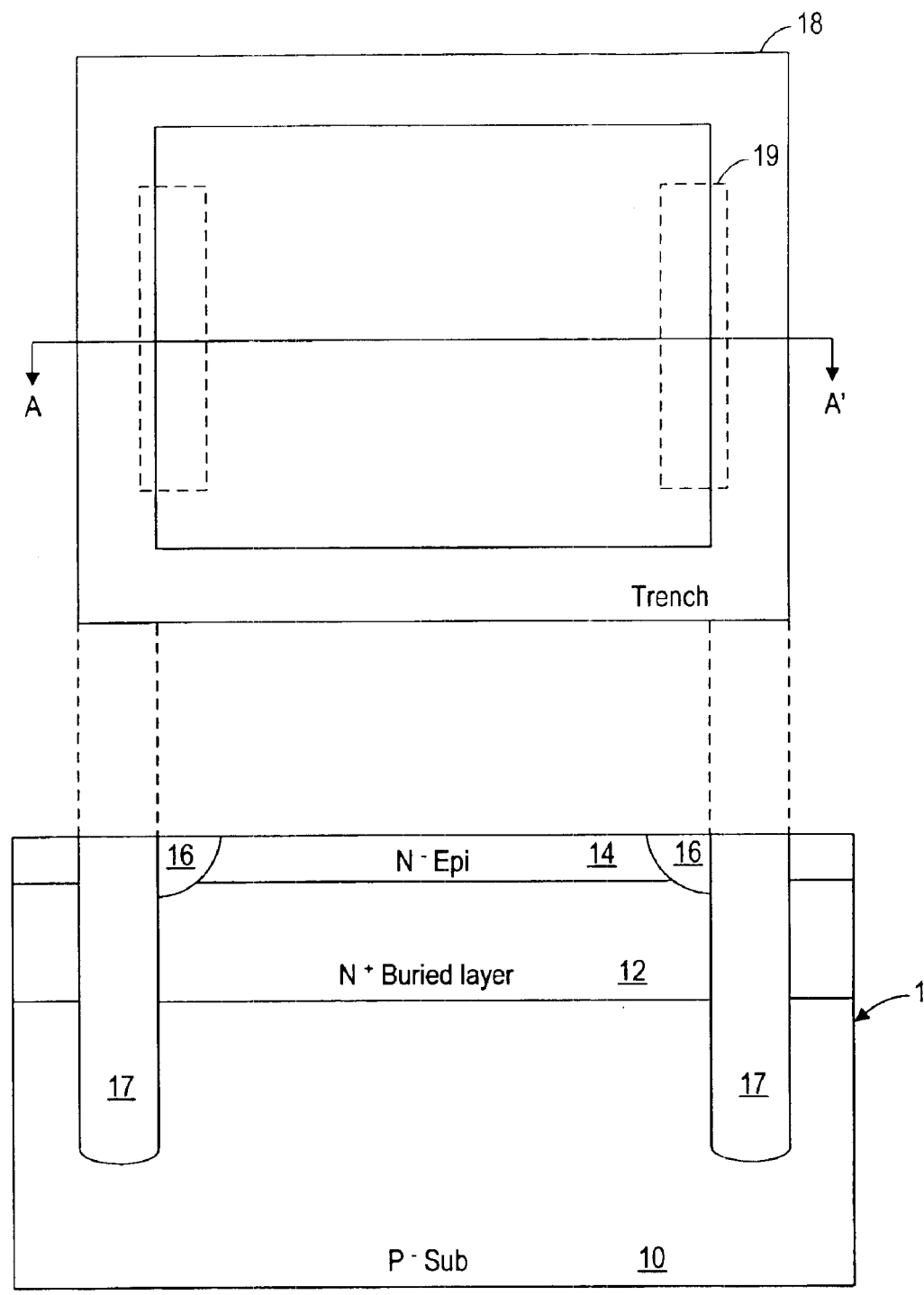
FIG. 1 illustrates a step in a fabrication process for making a heterojunction bipolar transistor according to one embodiment of the present invention.

FIG. 1 includes a top view and a corresponding cross-sectional view of a semiconductor substrate 1 in which the transistor is to be formed. The cross-sectional view of FIG. 1 is taken along a line A–A' of the top view.

In this example, the fabrication process uses a lightly doped p-type silicon substrate 10 as the starting material. An N+ buried layer 12 is formed on top of the silicon substrate 10. Buried layer 12 can have any suitable thickness and dopant concentration. The buried layer 12 may be 2.0 $\mu$m thick, and may have a dopant concentration of ~2E19 $cm^{-3}$. An N-type epitaxial layer (N-Epi) 14 is then formed on silicon substrate 10. N-Epi layer 14 can be formed using any conventional process, such as atmospheric chemical vapor deposition (CVD). N-Epi layer 14 may have a dopant concentration of ~1E16 $cm^{-3}$.

The present embodiment uses a sinker 16 and a trench isolation structure 17 to provide transistor isolation. Other conventional isolation techniques can also be used. A self-aligned sinker structure in a bipolar transistor fabrication process is described in U.S. Pat. No. 5,188,971, to Pollock et al., which is incorporated herein by reference in its entirety.

Referring to the top view of FIG. 1, a mask pattern 18 defines the location of the trench isolation structure 17 and a mask pattern 19 defines the location of the sinker structure 16. In one embodiment, the sinker is formed by lateral dopant diffusion through the trench sidewalls. In an alternate embodiment, the sinker is formed by implantation of dopants.

Figure 2:
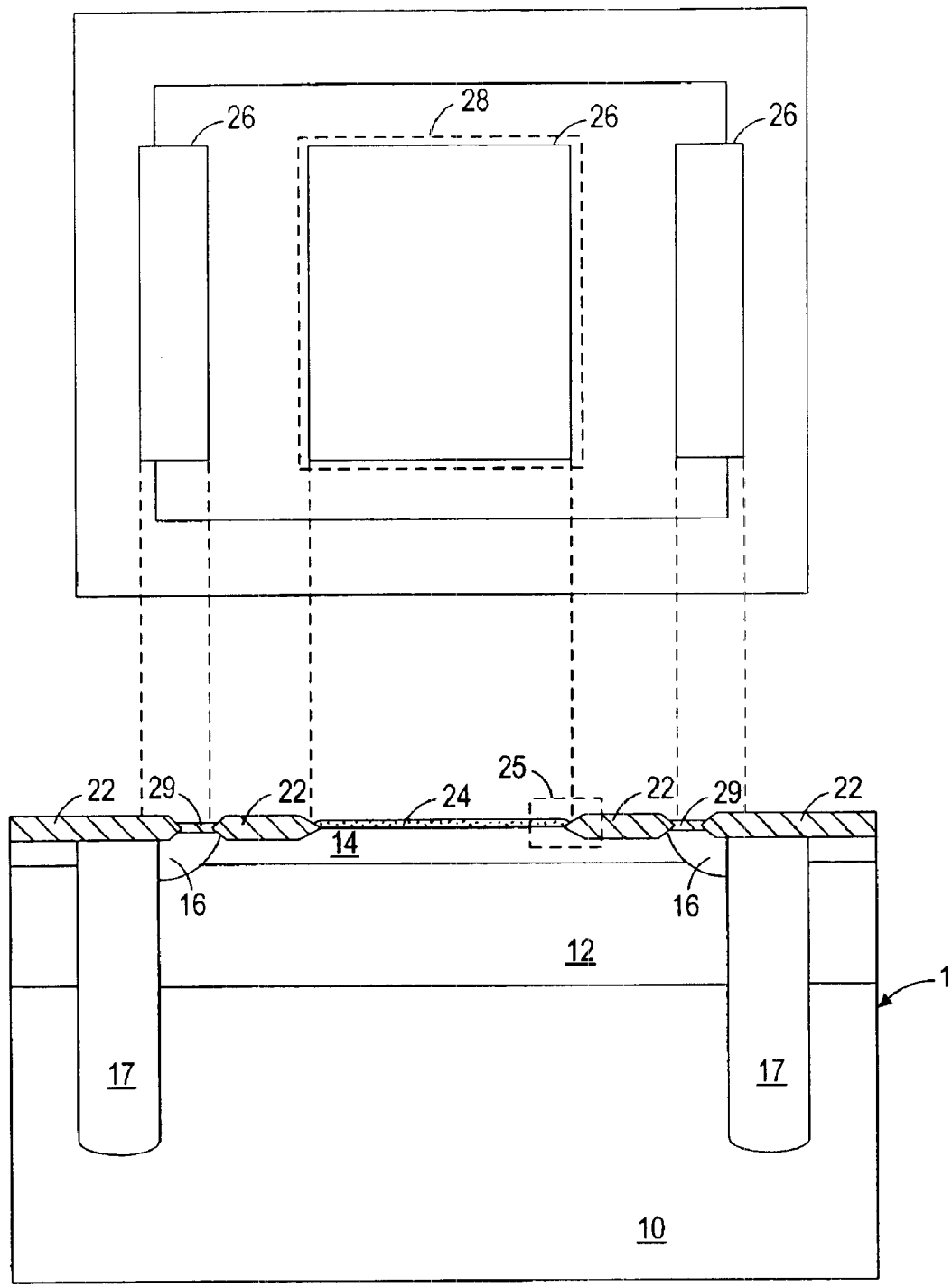
FIG. 2 illustrates a subsequent step in the exemplary fabrication process.

FIG. 2 illustrates a subsequent step in the exemplary fabrication process. A field oxidation process is performed to grow a field oxide layer 22 for defining the active areas where the bipolar transistor is to be formed. The active areas are defined by an active area mask 26 as shown in the top view of FIG. 2.

Field oxidation processes are well known in the art and any conventional field oxidation process can be used. For instance, a buffer oxide layer having a thickness of about 300 Å may be thermally grown on the top surface of the semiconductor substrate 1 using a conventional wet or dry process. Then, a nitride layer is deposited using, e.g., a plasma-enhanced CVD or a low pressure CVD process. The nitride layer is patterned using active area mask 26 of FIG. 2 (top view). Oxidation is carried out so that a field oxide layer is grown where the nitride layer is absent. After the oxidation process, the nitride layer is removed. Referring to FIG. 2, a field oxide layer 22 is thus formed on the surface of N-epi layer 14. Field oxide layer 22 may be approximately 5,000 Å thick.

In an alternate embodiment, a fully recessed local isolation process using deposited oxide is used to form the field oxide layer for defining the active areas. In an exemplary process, the active areas are defined using a buffer oxide and a nitride layer process, as described above. Then, a silicon etch process is carried out to remove silicon from areas not covered by the nitride layer. Then, an oxide layer is deposited over the entire surface. A chemical mechanical polishing process is performed to planarize the oxide layer. The polishing process stops on the nitride layer. The nitride layer is subsequently removed, thereby forming the field oxide isolation regions.

After the active areas are defined, the base region of the transistor can be formed. The exemplary heterojunction transistor of the present embodiment uses a selective epitaxial SiGe layer as the base layer. The selective epitaxial SiGe layer is doped with a P-type dopant such as boron. Referring to FIG. 2, a base mask 28 is applied to define the base region. After patterning using base mask 28, the 300 Å or so of buffer oxide on the semiconductor substrate 10 top surface inside the base region is removed to expose the bare silicon of N-epi layer 14. The 300 Å or so of buffer oxide in other active areas is left on the semiconductor substrate 1 top surface. Then, a selective epitaxial process is performed to selectively grow the SiGe layer on the semiconductor substrate 10. A process to grow the selective epitaxial SiGe layer may be performed a low pressure reactor using $B_2H_6$, $SiH_2Cl_2$, $GeH_4$, HCl, and $H_2$ gases at about 10 Torrs of pressure. The selective epitaxial process grows the SiGe layer only on exposed bare silicon areas (such as the base region). Such an epitaxial process will not grow a SiGe layer on areas covered by an oxide layer. As a result of the selective epitaxial process, SiGe base layer 24 in single crystalline form is grown in the base region of the semiconductor structure 10. The SiGe base layer 24 may have a thickness of 800 Å to 1000 Å.

Figure 2A:
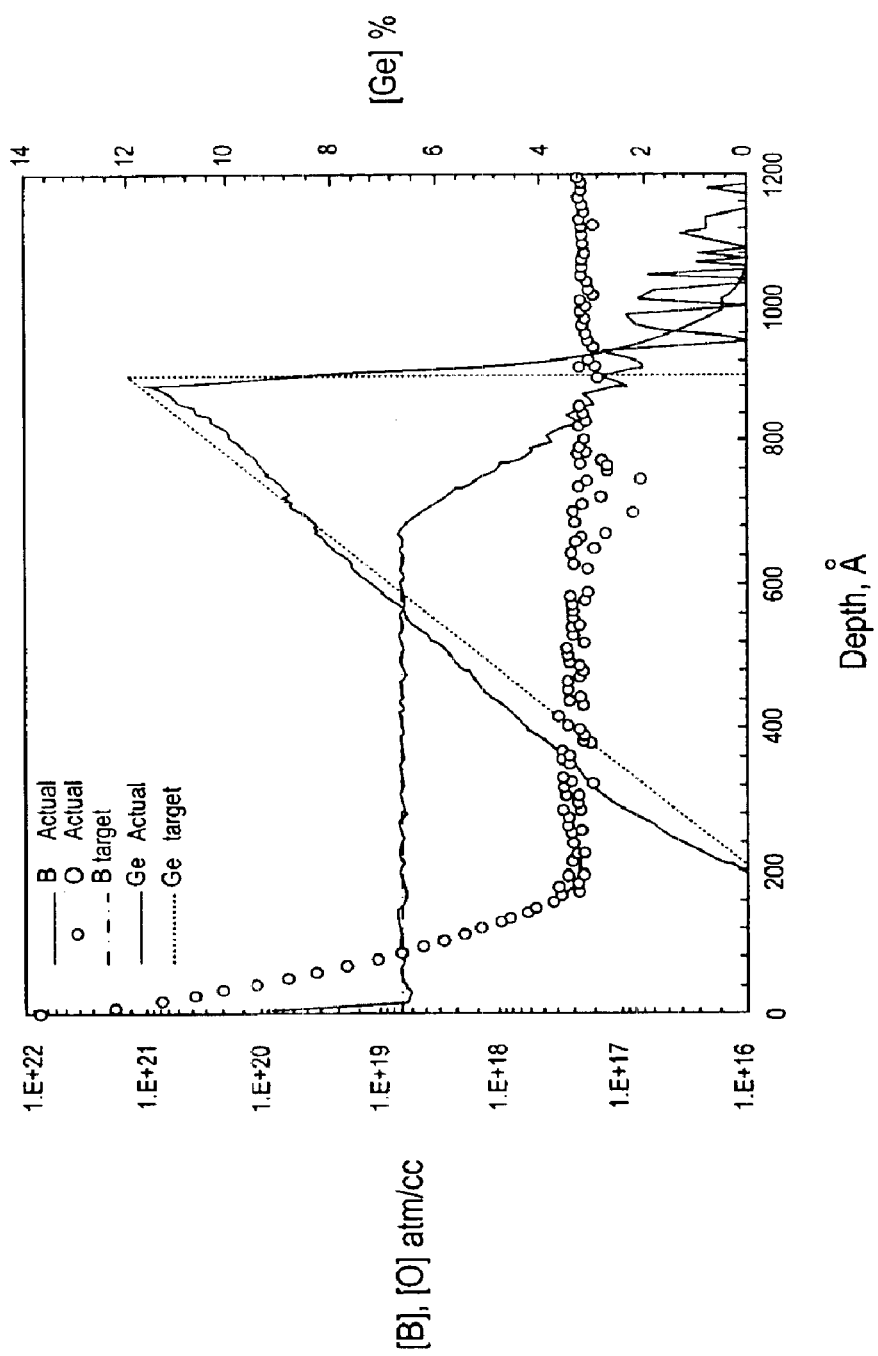
FIG. 2A illustrates a secondary ion mass spectroscopy (SIMS) profile of an exemplary heterojunction bipolar transistor having a selectively grown SiGe base layer.

The concentration of germanium in SiGe layer 24 may follow a triangular profile. FIG. 2A illustrates an exemplary secondary ion mass spectrometer (SIMS) profile of a heterojunction bipolar transistor having a SiGe base layer grown by a selective epitaxial process. Boron and germanium concentrations in the SiGe layer are shown. The germanium concentration in the SiGe base layer has an approximately triangular profile.

In an alternate embodiment, carbon may be incorporated into the SiGe base layer during the epitaxial process. The carbon functions to suppress the out-diffusion of a p-type dopant (such as boron) that is incorporated in the SiGe layer. The carbon concentration may range from about 0.04% to 0.5%, e.g., 0.1% to 0.2%.

Figure 3:
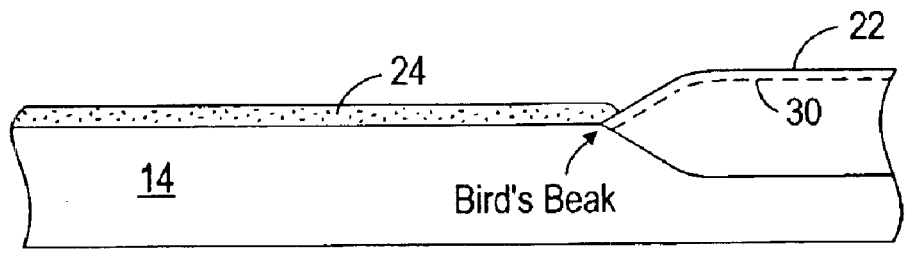
FIG. 3 is an enlarged cross-sectional view of a portion of FIG. 2.

After the formation of SiGe base layer 24, the buffer oxide layer 29 in the other active areas is removed. However, the removal of the buffer oxide layer 29 after the formation of the selectively grown SiGe base layer 24 in the base region could introduce device damage. To illustrate this phenomenon, a dotted box 25 in FIG. 2 denotes an inner bird's beak area of field oxide layer 22 around the base region, where SiGe layer 24 overlies the bird's beak. FIG. 3 is an enlarged cross-sectional view of box 25 of FIG. 2. Referring to FIG. 3, SiGe base layer 24 encroaches on the inner bird's beak of field oxide layer 22. The thickness of the field oxide layer 22 at the bird's beak can be as small as 150 Å.

When an etching process is performed to remove the 300 Å or so of buffer oxide remaining in the active areas other than the base region, field oxide layer 22 will also be etched. The dotted line 30 in FIG. 3 illustrates a hypothetical location of an etched top surface of field oxide layer 22 which could result after an etch step used to remove the 300 Å or so of buffer oxide. Removal of the oxide at the bird's beak areas can expose the N-epi layer 14 between the SiGe base layer and the etched top surface of the bird's beak. When the emitter of the transistor is subsequently formed, the exposed silicon areas adjacent the bird's beak can result in emitter-to-collector shorts, destroying the functioning of the transistor.

In accordance with the present embodiment, subsequent to the formation of selectively grown SiGe base layer 24, an isolation structure is formed in the transistor. As will be described in more detail below, the isolation structure protects the inner bird's beak of the field oxide layer adjacent the base region during processing so as to prevent the shorting problem mentioned above.

Figure 4:
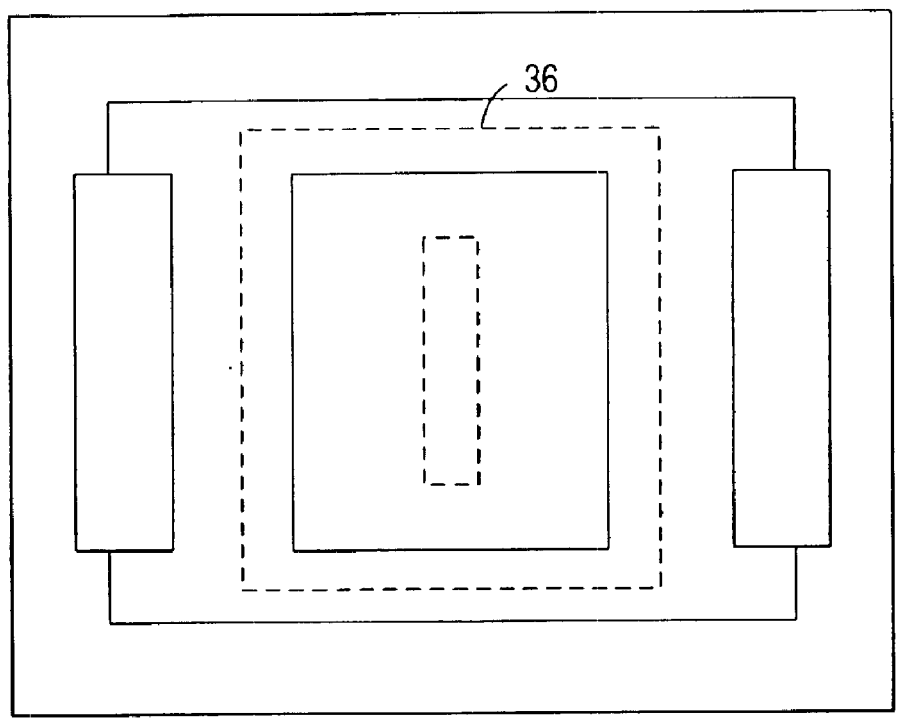
FIG. 4 illustrates a step in the exemplary fabrication process after the step in FIG. 2, wherein a dielectric isolation layer is formed.
Figure 4:
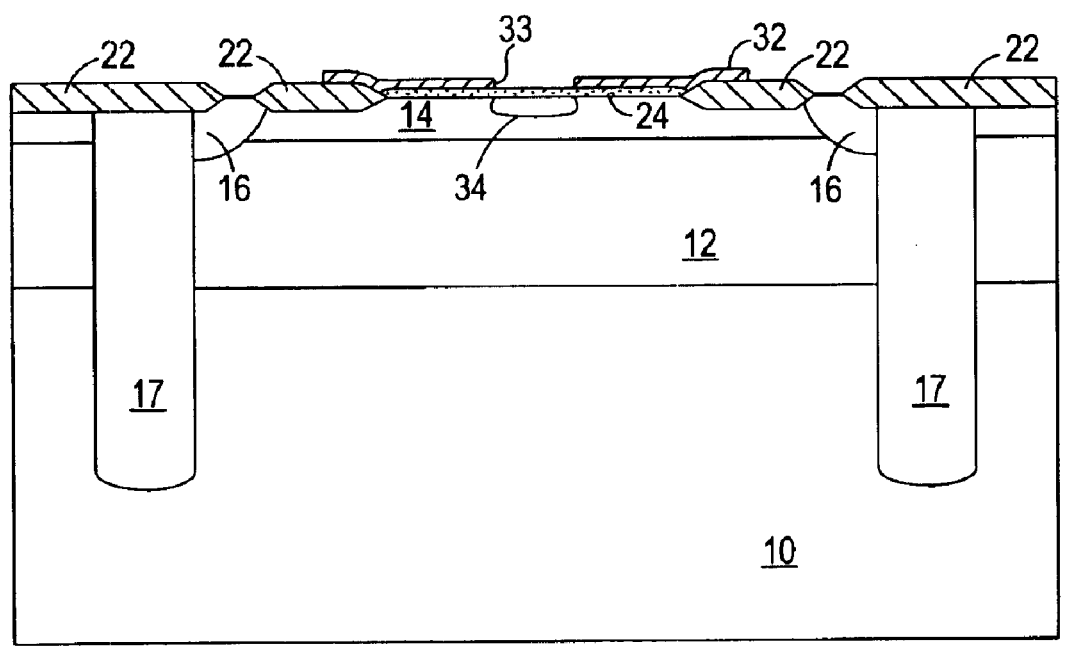

FIG. 4 illustrates the formation of such an isolation structure. In this example, the isolation structure is formed from a dielectric layer deposited over the upper surface of semiconductor substrate 1. The dielectric layer may be an oxide layer having a thickness of 750 Å that is deposited using a production plasma enhanced CVD reactor. The dielectric layer can then be masked with a photoresist mask 36, and etched to form a dielectric isolation layer 32, as shown in FIG. 4.

Dielectric isolation layer 32 covers the adjoining peripheral portions of SiGe base layer 24 and field oxide layer 22, including the bird's beak regions of field oxide layer 22 and the overlap region where the SiGe base layer 24 overlies the bird's beak. Mask 36 of FIG. 4 is a ring shape in this example, and thus allows for the formation of a ring-shaped dielectric isolation layer 32 through an etching process.

Referring to FIG. 4, dielectric isolation layer 32 overlies SiGe base layer 24 with the exception of a central region of SiGe base layer 24 exposed through a central aperture 33 of dielectric isolation layer 32.

Figure 5:
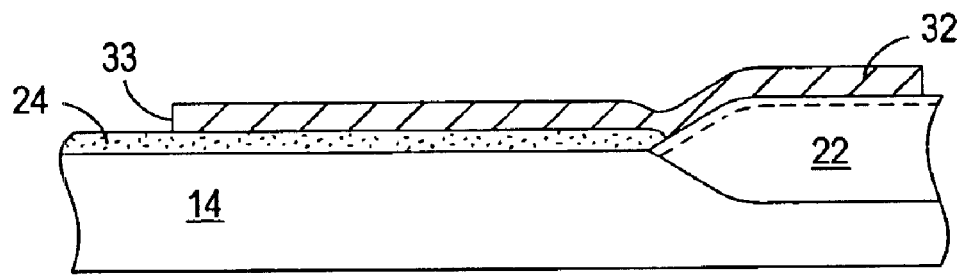
FIG. 5 is an enlarged cross-sectional view of a portion of FIG. 4.

FIG. 5 is an enlarged cross-sectional view of the peripheral areas of the SiGe layer 24 and the bird's beak region of the field oxide layer 22 of the exemplary embodiment of FIG. 4. In FIG. 5, dielectric isolation layer 32 overlies the adjoining and overlapping peripheral portions of SiGe layer 24 and field oxide layer 22. Because dielectric isolation layer 32 protectively covers the critical inner bird's beak area of field oxide layer 22 adjacent SiGe base layer 24 around the base region, inadvertent removal of the oxide in the underlying regions is prevented during the subsequent buffer oxide etching step, as discussed above. After the formation of the selectively grown SiGe base layer 24 and dielectric isolation layer 32, the base region of the transistor is completed.

In accordance with the present embodiment, the dielectric isolation layer 32 also may be used as a mask to perform a self-aligned collector pedestal implant. That is, after the ring-shaped dielectric isolation layer 32 is formed, but prior to the removal of the residual photoresist of mask 36, an implantation step is performed to introduce a phosphorus n-type dopant into the N-epi layer 14 through central aperture 33 of dielectric isolation layer 32 and the corresponding aperture of mask 36. As a result, a collector pedestal implant region 34 is formed in the N-epi layer 14. Collector pedestal implant region 34 may have a dopant concentration of 5E16 to 1E17 cm$^{-3}$.

Collector pedestal implant region 34 functions to minimize or eliminate performance degradation in the transistor caused by the Kirk effect. The Kirk effect is a well-known phenomenon where the base width is extended due to high-level injection of minority carriers into the collector. This causes an increase in base transit time and a corresponding decrease in device speed of operation. The collector pedestal implant, by introducing a heavily doped N-type region at the base-collector junction, prevents the space-charge region edge in the base from moving into the collector, thereby preventing base push-out.

Figure 6:
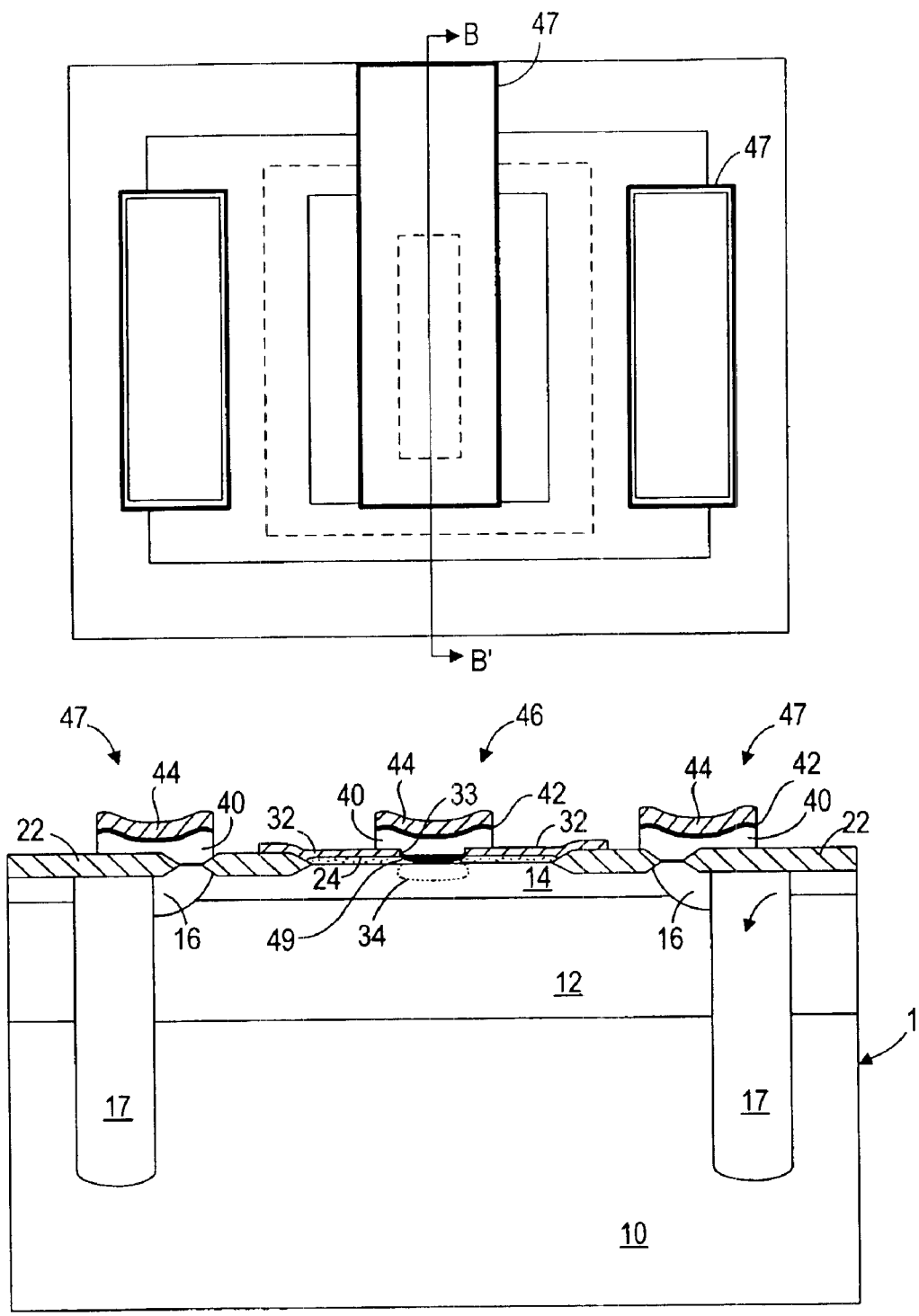
FIG. 6 illustrates a step in the exemplary fabrication process after the step in FIG. 4, wherein the emitter structure of the transistor is formed.

FIG. 6 illustrates a subsequent step in the exemplary fabrication process, wherein an emitter structure, and a collector pick up of the transistor are formed.

Referring to the example of FIG. 6, a polysilicon layer 40 is deposited over the top surface semiconductor substrate 10 of FIG. 4 and is doped with arsenic to approximately ~1E20/cm$^{-3}$. Alternatively, polysilicon layer 40 may be doped with phosphorus. Next, a refractory metal layer 42, which may be titanium, is formed on the top surface of the polysilicon layer 40. Then, a layer of an isolation dielectric 44, such as oxide, is deposited over the refractory metal layer 42. After the polysilicon layer 40, refractory metal layer 42, and dielectric layer 44 are formed, a mask 47 is applied and the layers are etched, with the etch process stopping on dielectric isolation layer 32. A titanium sintering process is then performed to convert the titanium refractory metal layer 42 on top of the polysilicon layer 40 into titanium suicide. Accordingly, emitter structure 46 and collector pick-up 47 are formed.

The doped polysilicon layer 40 of emitter structure 46 contacts SiGe base layer 24 though the central aperture 33 of dielectric isolation layer 32. Upon subsequent thermal processing steps, the dopant of polysilicon layer 40 diffuses about 250 to 300 Å into the central top surface of SiGe base layer 24, forming an emitter 49. Accordingly, an n-p emitter base junction is formed in alignment with central aperture 33 of dielectric isolation layer 32.

Figure 7:
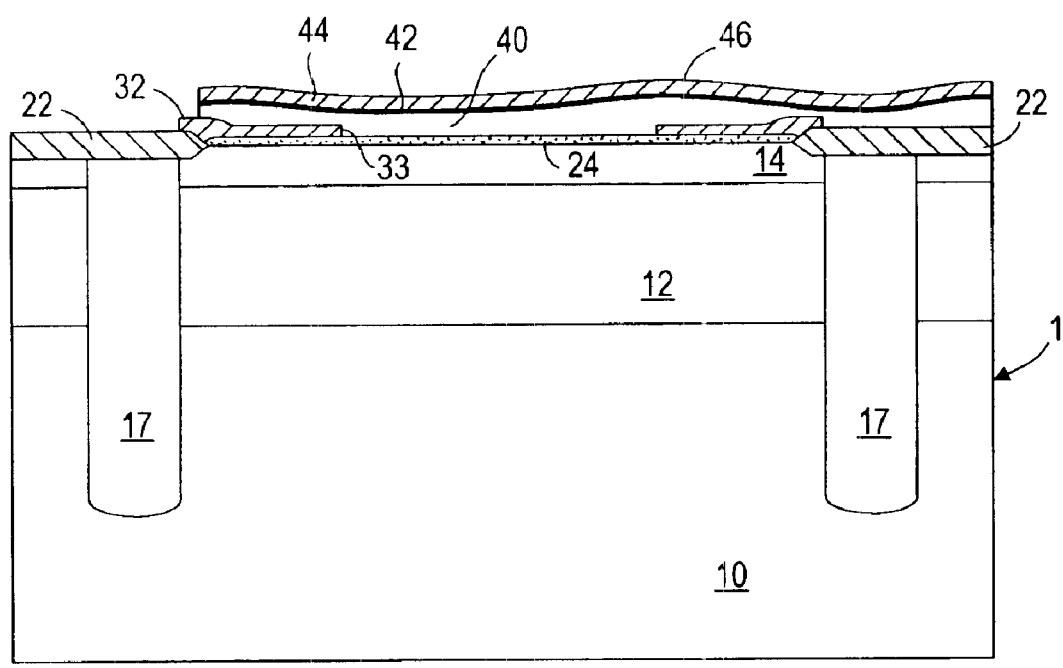
FIG. 7 is a cross-sectional view of an emitter structure of FIG. 6 taken along line B–B' shown in the top view of FIG. 6.

FIG. 7 is a cross-sectional view of the semiconductor structure 1 along a line B–B' in the top view of FIG. 6. The polysilicon and titanium silicide composite layers of the emitter structure 46 extend over field oxide layer 22 to be connected to other circuit structures in the integrated circuit.

Figure 8:
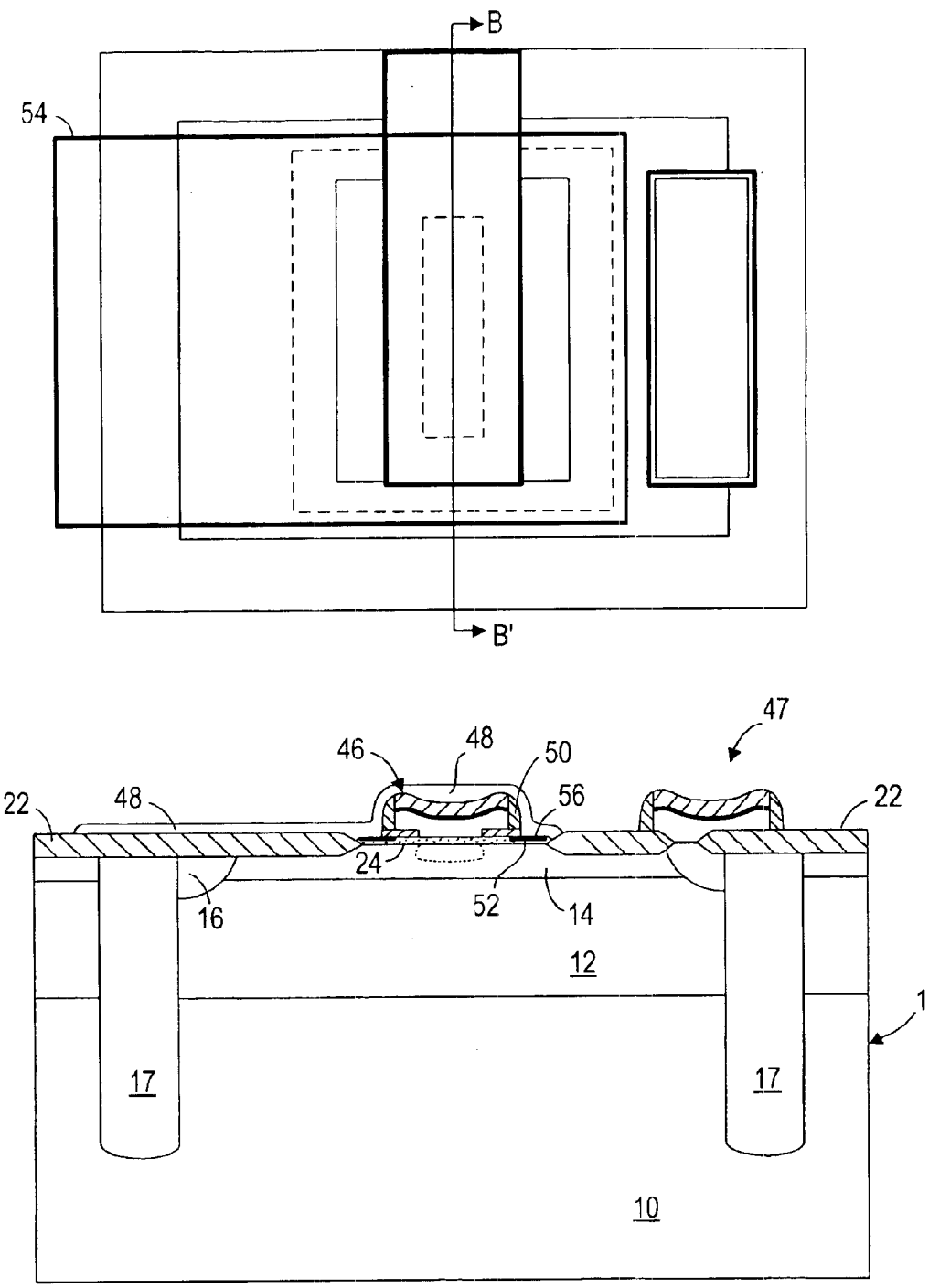
FIG. 8 illustrates a heterojunction bipolar transistor according to another embodiment of the present invention.
Figure 9:
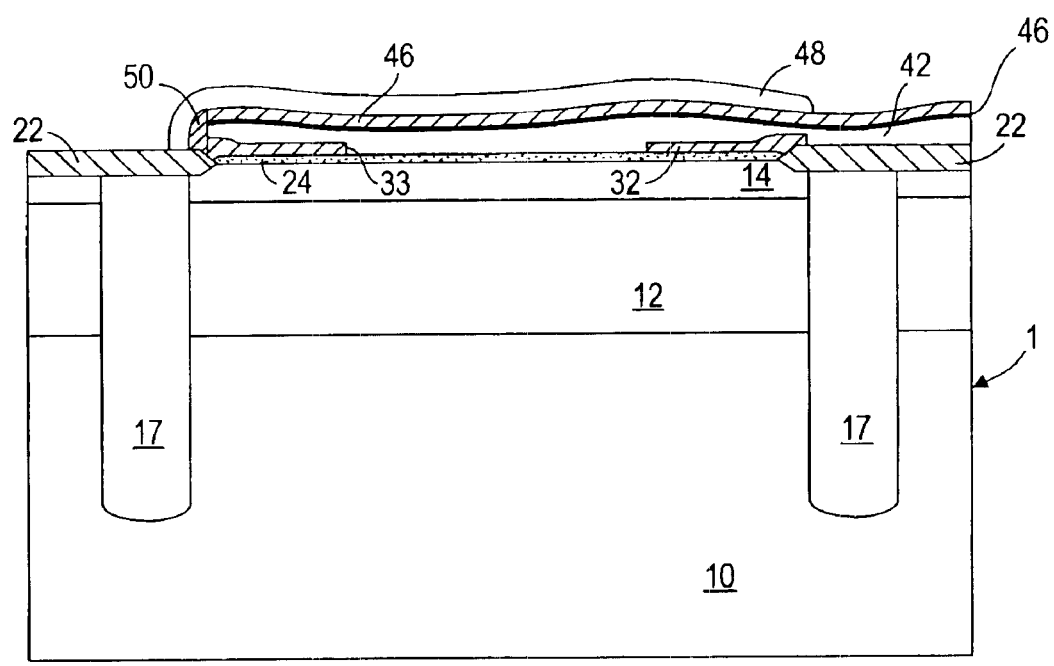
FIG. 9 is a cross-sectional view of the heterojunction bipolar transistor of FIG. 8 as viewed along line B–B' in FIG. 8.

Subsequent processing steps can be performed to complete the bipolar transistor, including providing a contact to the SiGe base layer 24 of the transistor. For instance, FIG. 8 illustrates a bipolar transistor within the present invention including a second polysilicon layer as the base contact. FIG. 9 is a cross-sectional view of the transistor of FIG. 8 as viewed along line B–B'.

To form such a base contact, and referring now to FIG. 8, a link implant using a p-type dopant (such as BF$_2$ of ~1E14 cm$^{-2}$ at 85 keV) may be performed using a mask to keep the implant away from the sinkers 16, thereby preventing increased base-collector capacitance. The boron forms a more heavily doped region 52 on the peripheral surface of SiGe base layer 24. The link implant region 52 thus formed is bound by the edge of emitter structure 46 and field oxide layer 22. Next, a spacer 50 is formed on the sides of emitter structure 46 by first depositing a dielectric layer, such as a silicon oxide layer, is formed over the emitter structure 46 and then anisotropically etching the dielectric layer. Accordingly, the SiGe layer 24, including link implant region 52 at the periphery of SiGe layer 24, is exposed adjacent to spacer 50. Subsequently, a second polysilicon layer 48 is deposited over the entire semiconductor structure. Polysilicon layer 48 is first implanted with a p-type dopant, to a volume concentration of ~1E19/cm$^{-3}$, and then patterned using a mask 54 to form extrinsic base contact 56 at the exposed areas of link implant region 52, thereby forming a conductive contact to SiGe base layer 24.

In the above described embodiments of the bipolar transistor, dielectric isolation layer 32 can serve at least three functions. First, after the emitter structure 46 is formed over SiGe base layer 24, the n-type dopants in the emitter structure 46 will diffuse into base layer 24 upon subsequent thermal process steps. The dielectric isolation layer 32 forms a dielectric wall around emitter structure 46 so that the high dopant concentration of the emitter region is spaced away from the edge of the extrinsic base region (link implant region 52). As a result, the emitter-base capacitance is reduced.

Second, the dielectric isolation layer 32 protects the critical bird's beak areas of the field oxide layer 22 to prevent emitter-collector shorts from occurring due to etching of the field oxide layer 22 during an etch step to remove a buffer oxide layer. Moreover, dielectric isolation layer 32 acts as an etch stop, thus preventing damage to the surface of the base layer 24 during etch steps used for the formation of emitter structure 46.

Third, the defining photoresist along with the dielectric isolation layer 32 can be used as a mask to introduce a self-aligned collector pedestal implant. The collector pedestal implant region 34 of FIG. 6 is centrally positioned at the collector-base junction and is self-aligned with the emitter structure 46 to provide maximum effectiveness.

In accordance with the present invention, the collector pedestal implant step is an optional step. In other embodiments, the collector pedestal implant step can be omitted. Furthermore, according to other embodiments of the present invention, the implantation step for the collector pedestal implant can be performed using other process sequences based on the fabrication process of the present invention. For example, the collector pedestal implant can be introduced to the semiconductor substrate 10 of FIG. 2 prior to the formation of the SiGe base layer 24. The collector pedestal implant region will thus cover the top surface of the entire base region. This approach avoids performing the collector pedestal implant through the central aperture of SiGe layer 24.

In another embodiment, after the active areas have been defined by growing the field oxide layer 22, the mask 36 of FIG. 4 can be applied on the surface of N-epi layer 14 for performing the collector pedestal implant. In this manner, the collector pedestal implant region can be limited to a small region, i.e., region 34. However, the collector pedestal implant region will not be self-aligned to the emitter opening formed by isolation structure 32. Limiting the collector pedestal implant region to a small region has the effect of reducing the collector-base capacitance. Thereafter, the photoresist material for the collector pedestal implant is removed and the SiGe layer is formed by an epitaxial process as described above with reference to FIG. 2.

The detailed description provided above is merely illustrative, and is not intended to be limiting. Numerous modifications and variations within the scope of the present invention are possible in view of this disclosure. The present invention is defined by the appended claims.

What is claimed is:

1. A method for forming a heterojunction bipolar transistor, comprising:
   providing a substrate of a first type;
   forming a buried layer of a second type in said substrate;
   forming an epitaxy layer of said second type on said buried layer;
   masking said surface of said epitaxy layer for defining an active area;
   forming a field oxide layer on said surface of said epitaxy layer surrounding said active area;
   patterning said substrate to define a base region in said active area;
   growing selectively a silicon germanium layer in said base region, said silicon germanium layer being bound by said field oxide layer; and
   forming a dielectric isolation layer over and contacting said silicon germanium layer and said field oxide layer, said dielectric isolation layer contacting an area of said field oxide layer adjacent said silicon germanium layer.

2. The method of claim 1, wherein said masking of said surface of said epitaxy layer for defining an active area comprises:
   forming a buffer oxide layer on a top surface of said epitaxy layer;
   forming a nitride layer over said buffer oxide layer; and
   patterning said nitride layer by removing said nitride layer over surfaces where said field oxide layer is to be formed.

3. The method of claim 2, wherein after said forming a field oxide layer, said nitride layer is removed.

4. The method of claim 3, wherein said patterning said substrate to define a base region in said active area comprises:
   removing said buffer oxide layer in said active area defined as said base region.

5. The method of claim 4, wherein said base region has a width that is less than a width of said active area.

6. The method of claim 1, wherein said dielectric isolation layer is formed with a central aperture through the dielectric isolation layer.

7. The method of claim 6, wherein said dielectric isolation layer comprises an oxide layer.

8. The method of claim 6, further comprising implanting dopants of said second type through the central aperture of the dielectric isolation layer, whereby a collector pedestal implant is formed.

9. The method of claim 6, further comprising forming an emitter structure over the dielectric isolation layer, said emitter structure contacting the silicon germanium layer through the central aperture.

10. The method of claim 1, further comprising:
    implanting dopants of said second type using said dielectric isolation layer as a mask,
    wherein said implanting forms a collector pedestal implant region.

11. The method of claim 10, wherein said implanting dopants is carried out through a photoresist layer defining said dielectric isolation layer.

12. The method of claim 1, further comprising:
    forming a polysilicon layer over said dielectric isolation layer and said silicon germanium layer, and
    patterning said polysilicon layer to form an emitter structure.

13. The method of claim 12, wherein said forming a polysilicon layer comprises:
    forming the polysilicon layer over said surface of said substrate;
    forming a refractory metal layer on a top surface of said polysilicon layer;
    forming a dielectric layer over a top surface of said refractory metal layer; and
    patterning said polysilicon layer, said refractory metal layer, and said dielectric layer.

14. The method of claim 12, further comprising:
    forming a link implant region of said first type in said silicon germanium layer using said emitter structure and said field oxide layer as a mask;
    forming a dielectric spacer adjacent said emitter structure;
    removing said dielectric isolation layer outside of said spacer;
    forming a second polysilicon layer over said surface of said substrate; and
    patterning said second polysilicon layer to form a contact to said link implant region of the silicon germanium layer.

15. The method of claim 1, wherein after patterning said substrate to define a base region, said method further comprises:

implanting dopants of said second type in said active area,
wherein said implanting forms a collector pedestal implant region.

16. The method of claim 1, wherein after patterning said substrate to define a base region and before growing the silicon germanium layer, said method further comprises:
masking said base region to define a collector pedestal implant region; and
implanting dopants of said second type in said collector pedestal implant region.

17. The method of claim 1, further comprising:
forming a polysilicon layer of the second type over the dielectric isolation layer, said polysilicon layer contacting the silicon germanium layer through an aperture of the dielectric isolation area; and
etching the polysilicon layer of the second type to form an emitter structure, wherein said etching uses the dielectric isolation layer as an etch stop.

18. A method for forming a heterojunction bipolar transistor, comprising:
providing a substrate of a first type;
forming a buried layer of a second type in said substrate;
forming an epitaxy layer of said second type on said buried layer;
masking said surface of said epitaxy layer for defining an active area, wherein said masking of said surface of said epitaxy layer for defining an active area comprises:
forming a buffer oxide layer on a top surface of said epitaxy layer,
forming a nitride layer over said buffer oxide layer, and
patterning said nitride layer by removing said nitride layer over surfaces where said field oxide layer is to be formed;
forming a field oxide layer on said surface of said epitaxy layer surrounding said active area, wherein after said forming a field oxide layer, said nitride layer is removed;
patterning said substrate to define a base region in said active area;
growing selectively a silicon germanium layer in said base region, said silicon germanium layer being bound by said field oxide layer; and
forming a dielectric isolation layer over said silicon germanium layer and said field oxide layer, said dielectric isolation layer covering an area of said field oxide layer adjacent said silicon germanium layer,
wherein after forming said dielectric isolation layer, said method further comprises removing said buffer oxide layer in active areas not defined as said base region, wherein said dielectric isolation layer protects said field oxide layer adjacent said silicon germanium layer from said oxide removal process.

19. The method of claim 18, wherein the silicon germanium is doped with carbon.

20. A method of forming a bipolar transistor comprising:
providing a first layer of a first type in a semiconductor substrate as a collector of the transistor;
forming a second layer of a second type over the first layer as a base of the transistor, said second layer comprising selectively grown silicon germanium;
forming a dielectric isolation layer over and contacting the second layer, said dielectric isolation layer having a central aperture;
forming a field oxide layer over the first layer, wherein the second layer and the dielectric isolation layer are formed within the field oxide layer, and the dielectric isolation layer also at least temporarily contacts an inner portion of an upper surface of the field oxide layer; and
forming a third layer of the first type over the dielectric isolation layer, and patterning the third layer to form an emitter structure of the transistor, said third layer contacting the second layer through the central aperture.

21. The method of claim 20, further comprising implanting a dopant of the first type through the central aperture of the dielectric isolation layer, thereby forming a collector pedestal implant region.

22. The method of claim 20, further comprising forming a dielectric spacer coupled to the emitter structure over a portion of the dielectric isolation layer.

23. The method of claim 20, further comprising introducing a dopant of the second type onto a contact region of the second layer adjacent the emitter structure, and forming a base contact coupled to the contact region.

24. The method of claim 20, wherein materials of the second layer and the third layer are selected so as to form a heterojunction between the second layer and the emitter structure.

25. The method of claim 20, wherein the second layer comprises silicon germanium.

26. The method of claim 25, wherein the silicon germanium is doped with carbon.

27. The method of claim 25, wherein the silicon germanium layer is deposited using a selective epi process.

28. The method of claim 20, wherein during said patterning the third layer is etched to form the emitter structure using the dielectric isolation layer as an etch stop.

29. A method of forming a bipolar transistor comprising:
providing a first layer of a first type in a semiconductor substrate as a collector of the transistor;
providing a second layer of a second type over the first layer as a base of the transistor, said second layer comprising silicon germanium;
forming a field oxide layer, the field oxide layer surrounding the second layer;
forming a dielectric isolation layer over and contacting the second layer, and over and contacting an inner region of the field oxide layer around the second layer, said dielectric isolation layer having a central aperture; and
forming an emitter structure of the first type over the dielectric isolation layer, said emitter structure in contact with the second layer through the central aperture.

30. The method of claim 29, further comprising forming a collector pedestal implant region aligned with the central aperture.

31. A method of making a bipolar transistor comprising:
forming a first layer of a first type in a semiconductor substrate as a collector of the transistor;
forming an isolation region of a dielectric material, the isolation region being one of a trench isolation region and a field oxidation layer;
forming a second layer of a second type over the first layer as a base of the transistor, said second layer comprising silicon germanium;
forming a dielectric isolation layer over and in contact with the second layer and over and in contact with the isolation region, said dielectric isolation layer having a central aperture; and forming an emitter structure of the first type over the dielectric isolation layer, said emitter structure in contact with the second layer through the central aperture.

32. The method of claim 31, wherein the isolation region comprises the field oxide layer; and forming a peripheral implant region between the field oxide layer and the emitter structure.

33. The method of claim 31, wherein the silicon germanium is doped with carbon.

34. The method of claim 31, wherein the silicon germanium is doped with carbon.

35. The method of claim 34, further comprising implanting a dopant of the first type through the central aperture of the dielectric isolation layer, thereby forming a collector pedestal implant region.

36. The method of claim 34, further comprising forming a dielectric spacer coupled to the emitter structure over a portion of the dielectric isolation layer.

37. The method of claim 34, further comprising introducing a dopant of the second type onto a contact region of the second layer adjacent the emitter structure, and forming a base contact coupled to the contact region.

38. The method of claim 34, wherein materials of the second layer and the third layer are selected so as to form a heterojunction between the second layer and the emitter structure.

39. The method of claim 34, wherein the silicon germanium layer is deposited using a selective epi process.

40. A method for forming a heterojunction bipolar transistor, comprising:

providing a substrate of a first type;

forming a first layer of a second type over the substrate;

growing selectively a silicon germanium layer, said silicon germanium layer being of the first type and forming a base of the transistor;

forming a field oxide layer in contact with the first layer, wherein the silicon germanium is formed within the field oxide layer;

forming a dielectric isolation layer in contact with the silicon germanium layer and an inner portion of the field oxide layer, and depositing a conductive layer in contact with the silicon germanium layer, and patterning the conductive layer to form an emitter structure.

41. The method of claim 40, wherein the silicon germanium is doped with carbon.

* * * * *